US008157048B2

(12) United States Patent
Banter et al.

(10) Patent No.: US 8,157,048 B2

(45) Date of Patent: Apr. 17, 2012

(54) SPLASH PROOF ACOUSTICALLY RESISTIVE COLOR ASSEMBLY

(75) Inventors: Chad Banter, Bear, DE (US); Andrew J. Holliday, Wilmington, DE (US); Victor Lusvardi, Chadds Ford, PA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 12/428,104

(22) Filed: Apr. 22, 2009

(65) Prior Publication Data

US 2010/0270102 A1 Oct. 28, 2010

(51) Int. Cl.

| | |
|---|---|
| ***A47B 81/06*** | (2006.01) |
| ***F01N 5/00*** | (2006.01) |
| ***G10K 11/00*** | (2006.01) |
| ***H04R 1/02*** | (2006.01) |
| ***H04R 25/00*** | (2006.01) |
| ***H05K 11/00*** | (2006.01) |

(52) U.S. Cl. ........ 181/198; 181/149; 181/175; 181/211; 381/189; 381/386

(58) Field of Classification Search .................. 181/198, 181/149, 175; 381/386, 189

See application file for complete search history.

(56) References Cited

U.S. PATENT DOCUMENTS

| | | | | |
|---|---|---|---|---|
| 3,976,848 A | | 8/1976 | Estes | |
| 4,071,040 A | * | 1/1978 | Moriarty | 137/199 |
| 4,073,366 A | | 2/1978 | Estes | |
| 5,116,650 A | | 5/1992 | Bowser | |
| 5,286,279 A | | 2/1994 | Wu | |
| 5,342,434 A | | 8/1994 | Wu | |
| 5,462,586 A | | 10/1995 | Sugiyama et al. | |
| 5,625,688 A | * | 4/1997 | Ford et al. | 379/433.09 |
| 5,828,012 A | * | 10/1998 | Repolle et al. | 181/175 |
| 6,512,834 B1 | * | 1/2003 | Banter et al. | 381/386 |
| 6,932,187 B2 | * | 8/2005 | Banter et al. | 181/149 |
| 6,987,445 B1 | * | 1/2006 | Burnett et al. | 340/387.1 |
| 7,357,217 B1 | * | 4/2008 | Viveros | 181/129 |
| 2005/0077102 A1 | | 4/2005 | Banter et al. | |

FOREIGN PATENT DOCUMENTS

| | | |
|---|---|---|
| EP | 1 933 588 | 6/2008 |
| GB | 2 218 298 | 11/1989 |
| JP | 59 144297 | 8/1984 |
| JP | 2005 334758 | 12/2005 |

OTHER PUBLICATIONS

International Search Report for application No. PCT/US2010/001202.

* cited by examiner

*Primary Examiner* — Elvin G Enad

*Assistant Examiner* — Christina Russell

(74) *Attorney, Agent, or Firm* — Richard W. Ellis

(57) ABSTRACT

An acoustically resistive protective cover assembly for an opening in a casing is provided, the casing separates an enclosed space from the ambient space and has an exposed face oriented toward the ambient space and an internal face oriented toward the internal space. The cover assembly comprises an acoustically resistive porous material disposed upon the exposed face of the case and an acoustically resistive water repellant material disposed upon the internal face of the case.

14 Claims, 3 Drawing Sheets

SPLASH PROOF ACOUSTICALLY RESISTIVE COLOR ASSEMBLY

BACKGROUND OF THE INVENTION

Electronic devices such as cellular phones, pagers, radios, hearing aids, headsets, barcode scanners, digital cameras, etc. are designed with enclosures (or cases) having small openings located over an acoustic transducer (such as a bell, speaker, microphone, buzzer, loudspeaker, etc) to allow sound transmission.

Acoustic covers are placed over openings to protect the transducer from damage from dust and spray. Acoustic covers comprising micro porous membranes and non porous films are known to provide protection from spray and dust; however these materials have high acoustic resistivity, thereby lowering quality of sound transmission in certain applications. While known protective covers made of porous fabrics, wovens and non-wovens have relatively lower acoustic resistivity and thus higher quality of sound transmission, these materials do not offer adequate protection against liquid spray. Thus, a need exists for an acoustic cover which has low acoustic resistivity and which provides adequate protection against spray and dust.

SUMMARY OF THE INVENTION

In one aspect, an acoustically resistive cover is provided having a first layer including a porous material and a second water repellant layer including a porous material wherein there is space between the first layer and the second water repellent layer.

In another aspect, an acoustically resistive cover is provided for an opening in an enclosure, the enclosure separating an enclosed space from ambient space, the acoustically resistive cover including a diffusion layer including an acoustically resistive porous material adjacent to ambient space, and a water repellant layer including an acoustically resistive porous material adjacent to the enclosed space.

In still another aspect, an acoustically resistive cover is provided for an opening in a case, the case separating an enclosed space from the ambient space and having an exposed face oriented toward the ambient space and an internal face oriented toward the internal space, the acoustically resistive cover including an acoustically resistive porous material disposed upon the exposed face of the case, and acoustically resistive water repellant material disposed upon the internal face of the case.

In yet another aspect, a water resistant enclosure is provided including a case defining an internal space within the enclosure and an ambient space outside the enclosure an opening within the case, and an acoustically resistive cover assembly including a diffusion layer including a porous material adjacent to the ambient space, and a water repellant layer including an acoustically resistive material adjacent to the internal space and wherein a space is provided between the diffusion layer and the water repellant layer.

DETAILED DESCRIPTION OF THE INVENTION

The present invention relates to acoustically resistive cover assemblies for acoustic transducers. More specifically, the invention enables the use of highly porous materials with low acoustic resistivity for reliable protection against water spray and dust. The acoustically resistive cover assembly described herein offers a novel combination of both water splash protection and low acoustic resistivity.

Figure 1:
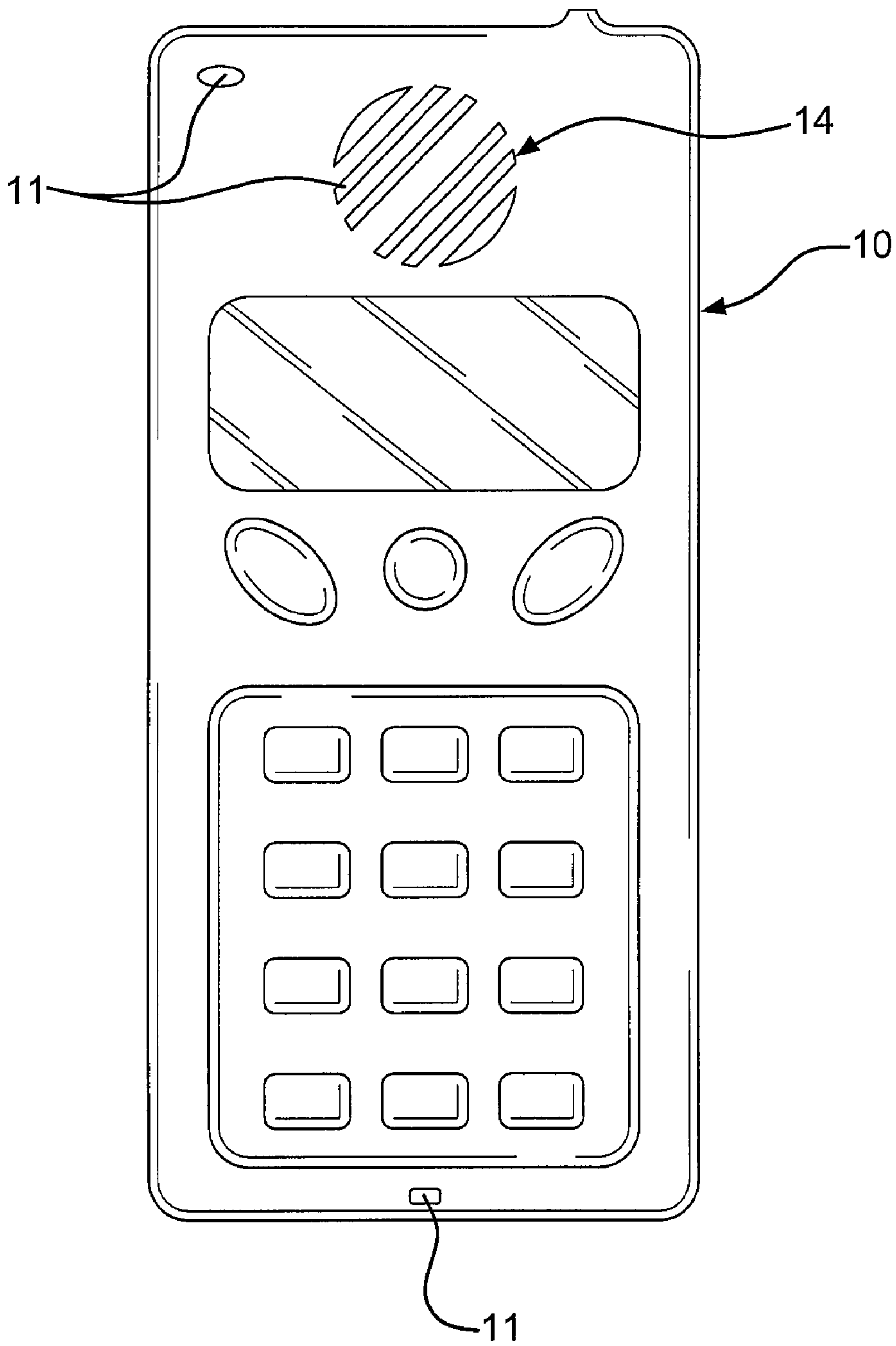
FIG. 1 is an external view of a cellular phone front casing with a splash proof acoustically resistive cover assembly covering the openings.

FIG. 1 shows an external view of the front case 10 of a cellular phone having small openings 11. The openings provide acoustic pathways between electronic transducers and the environment. The number, size, shape of the openings may vary. Alternate opening designs include narrow slots or a variable number of circular openings. An acoustically resistive cover assembly 14 is mounted on the opening and covers the entire opening. The cover assembly may be mounted within or on the outside of the case.

Figure 2:
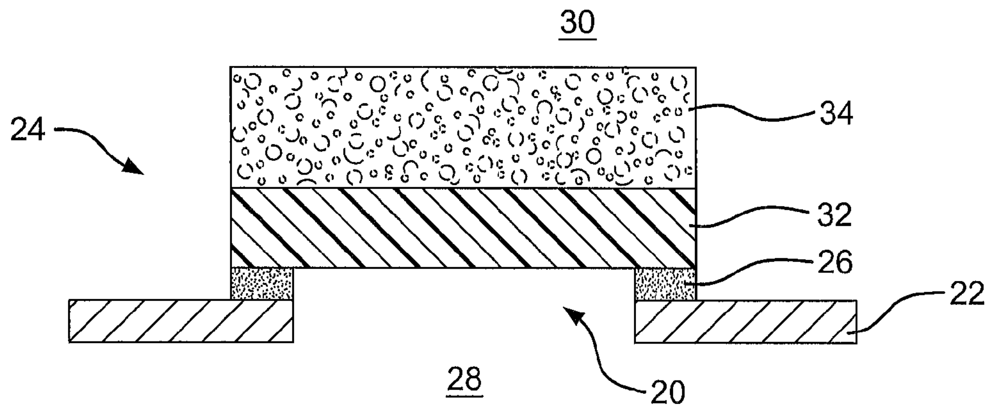
FIG. 2 represents a sectional view of an embodiment of the acoustically resistive cover assembly.

FIG. 2 depicts one embodiment of the acoustically resistive cover assembly. The assembly comprises an acoustically resistive porous water repellant layer 32 disposed adjacent to the enclosure and an acoustically resistive diffusion layer 34 disposed adjacent to the ambient space. Opening 20 of enclosure wall 22, is covered with the acoustically resistive cover assembly 24. The cover assembly 24 separates the space within the enclosure 28 from the ambient space 30. The cover is attached at its perimeter by means of a double sided adhesive 26. Although an adhesive ring is shown, the cover assembly may be attached to the case by a variety of other means. For example, cover assembly comprising the two acoustically resistive layers may be assembled using known attachment methods involving heat and pressure including but not limited to heat welding, ultrasonic welding, RF welding, etc. The assembly may be welded directly over the opening of the enclosure wall. The cover assembly may also be injection molded to a plastic encapsulation cap which can then be attached to the opening of the enclosure wall. The assembly may be configured in a "captive form" where the assembly is held captive between two adhesive support systems at the perimeter.

The layers of the cover assembly are all acoustically resistive materials. Acoustically resistive materials are highly porous, open pore materials which have low airflow resistance. Preferably, acoustically resistive materials have an air flow resistance of less than 500 Rayls. More preferably, the material has an air flow resistance of less than 250 Rayls and most preferably less than 150 Rayls. Examples of suitable acoustically resistive materials include, but are not limited to foams, nonwovens, wovens, knits, scrims and meshes. Such materials generally have a nominal pore size greater than 5 microns. These may be constructed of many polymers including, but not limited to polyolefins like polyethylene and polypropylene, polyamides, polyurethane, polyesters or fluoropolymers like PTFE, PFA, FEP, PVDF. Acoustically resistive perforated metal foils as described in U.S. Pat. No. 6,932,187 may be used as well.

The outermost layer is a diffusion layer. The diffusion layer serves to reduce the velocity of spray water that strikes the water repellant layer. Selection of an appropriate material for the diffusion layer requires consideration of air permeability, porosity, modulus, and layer thickness. A diffusion layer may be selected with reference to the water repellant layer and challenge spray. Water repellant layers with low water entry pressures subject to high velocity spray may require diffusion layers that dramatically reduce water velocity. Water repellant layers with high water entry pressures may demand less of the diffusion layer, but such materials typically have high acoustic resistance. Accordingly, a diffusion layer has appropriate tortuosity, modulus and thickness to sufficiently reduce spray velocity to prevent spray water from penetrating a water repellant layer during the water splash test.

A diffusion layer may be selected by empirical means by subjecting the layer to a stream of water spray at a challenge pressure and velocity. An appropriate diffusion layer should adequately reduce water velocity for the challenge presented. In most applications, the velocity is sufficiently reduced by a diffusion layer if the water exiting it is in the form of droplets. Such droplets should have sufficiently low velocity at water repellant layer to prevent water penetration.

Diffusion layers may be constructed of tortuous materials like reticulated foams, wovens, non-wovens, scrims, knits and fabrics. Materials with open pores connected to form networks or channels may be used. Spacer fabrics known in the art may also be used as a diffusion layer. Spacer fabrics comprise an upper and lower fabric layer spaced apart from each other using a plurality of spacer fibers which act as tiny support columns between the layers. Preferably, the diffusion layer is constructed of conformable materials to facilitate installation into the enclosure. The diffusion layer may be constructed from polymeric materials like polyurethane, polyethylene, polypropylene, polyamides, polyesters or fluoropolymers like PTFE, PFA, FEP, PVDF, or inorganic oxides, metals, fumed silica and metalized foam layers may also be used. Diffusion layers may comprise laminates or layers of either similar or dissimilar materials.

The diffusion layer may provide added benefits such as protection from wind-noise, thereby further improving transducer acoustic performance.

The water repellant layer serves as a barrier to water droplets or low velocity water and prevents low velocity water from penetrating the cover assembly. Because the diffusion layer reduces spray water velocity, the water repellant layer can have a more open structure that has low acoustic resistance.

However, the porous water repellant layer has a water entry pressure of at least 0.1 psi. The water repellant layer may be constructed of polymeric materials like polyurethane, polyethylene, polypropylene, polyamides, polyesters or fluoropolymers like PTFE, PFA, FEP, PVDF, or inorganic oxides, such as silica. The water repellant layer may also comprise laminates or layers of either similar or dissimilar materials.

The water repellant layer has a hydrophobic surface. This layer may also be rendered oleophobic (oil-repellant) to improve repellency to lower surface tension liquids. Known water and oil repellant materials and methods are well known in the art, some of which are described in U.S. Pat. Nos. 5,116,650, 5,462,586, 5,286,279, and 5,342,434.

In some aspects, it may be advantageous to provide a gap between the diffusion layer and the water repellant layer. The gap may provide a further means of reducing velocity of water bearing on the surface of the water repellant layer, may provide drainage or may improve the angle of incidence of water. Without being bound to theory, it has been discovered that materials that do not function well as water barriers when layered in contact, do in fact prevent water spray entry when a gap is provided between such layers. Advantageously, the gap does not impact acoustic performance.

Figure 3:
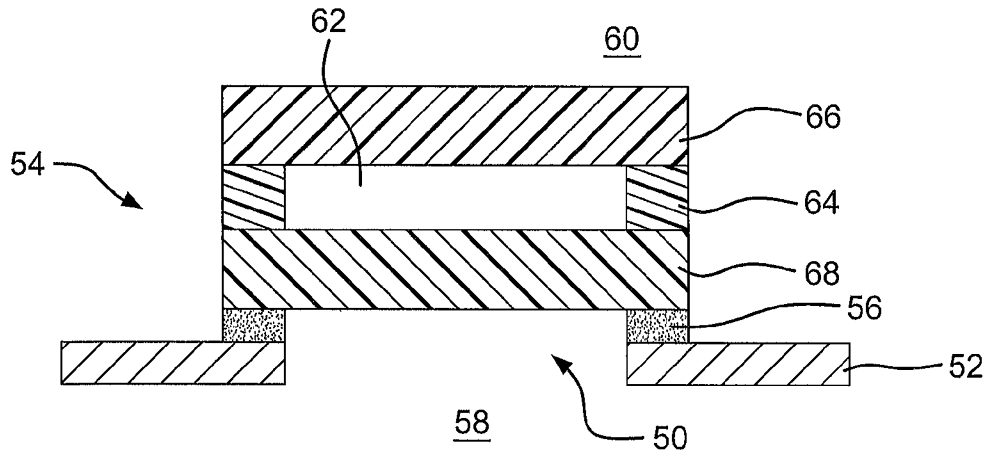
FIG. 3 is a sectional view of another embodiment of the acoustically resistive cover assembly.

FIG. 3 depicts another embodiment of the invention. The opening 50 of an enclosure wall 52, is covered with the acoustic cover assembly 54 by means of a double sided adhesive 56. The assembly 54 separates the space within the enclosure 58 from the ambient space 60.

The assembly comprises two acoustically resistive porous layers separated by means of a gap 62. The first layer, 66 is a diffusion layer and comprises an acoustically resistive porous material. This layer may be optionally rendered water or oil repellant. The second layer 68 comprises an acoustically resistant water repellant porous material. The gap may be created by providing a spacer 64 at the perimeter of the two porous layers 66 and 68. Selection of an appropriate thickness of spacer requires consideration not only of the desired gap, but also of the stiffness, porosity, thickness and tortuosity of porous layer 66 and the unsupported area of porous layer 66. Preferably, a spacer is selected of appropriate thickness and material to provide a minimum gap between the diffusion layer and the water repellant layer of greater than 1 mm, more preferably, the spacer is selected to provide a minimum gap that is greater than 1.5 mm.

Any material or design that maintains a gap between the water repellant layer and the diffusion layer may be selected as a spacer. The spacer may be shaped in the form of a ring or such other form that will maintain spacing when placed between the two acoustically resistive porous layers. Suitable spacers include non-porous materials like soft elastomeric materials, adhesives, or foamed elastomers like silicone rubber and silicone rubber foam. Other polymeric foams may be used as well. Closed cell polyurethane foam is a preferred spacer. Adhesive spacers can be thermosets or thermoplastics including Acrylic, Silicone, Polyamide, Polyester, Polyolefin, Polyurethane polymers. Double-sided adhesive spacers may be used.

Figure 4:
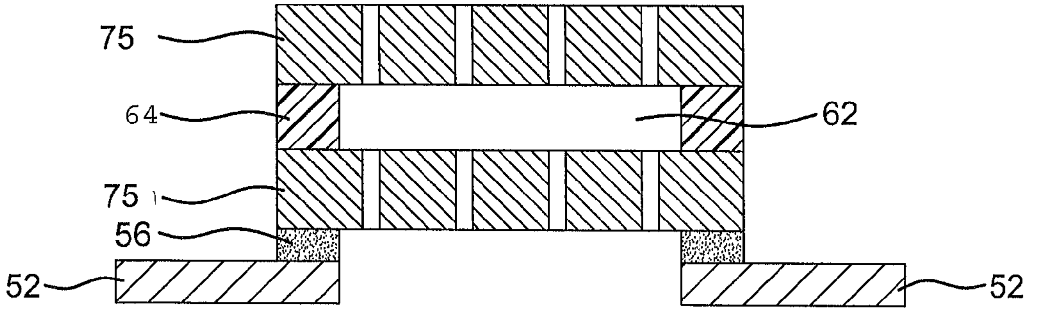
FIG. 4 is a sectional view of another embodiment of the acoustically resistive cover assembly.

In an embodiment depicted in FIG. 4, a pair of perforated elements 75 is separated by a gap 62. The first layer exposed to the spray environment is a perforated element that serves as a diffusion layer by reducing the velocity of a water spray. The second layer may also be a perforated element. The first layer may be constructed from an impermeable material, such as a metal foil or polymeric sheet. The perforations may vary in size and distribution, and may be empirically determined for a given challenge spray by methods described herein. The second perforated element must have a water repellant surface. In this way the water exiting the first layer is at sufficiently low velocity that it beads up and runs off the surface of the second, water repellant layer. In this embodiment, a gap is necessary to ensure good acoustic performance. If the gap were eliminated, misalignment of perforations may degrade acoustic performance, yet alignment of perforations may reduce water resistance to spray water.

Test Methods

Air Flow Resistance

Rayl is a measure of the resistance of the sample to air flow. The pressure drop (ΔP) through the sample (diameter of 4 cm) was measured at a fixed air flow rate of 10 scfh. The pressure drop was converted to Rayl units using the equation below:

$$\text{Resistance (in } Rayls\text{)} = \frac{\Delta P \cdot \text{Area of sample}}{Flowrate}$$

For acoustically resistive materials, air flow resistance correlates directly to acoustic resistivity.

Water Entry Pressure

Water entry pressure is a test method for measuring water intrusion through a material. A test sample was clamped between a pair of testing fixtures, the lower fixture had the ability to pressurize a section of the sample with water. A piece of pH test paper was placed on top of the sample to serve as an indicator of evidence for water entry. The sample was then pressurized in small increments of pressure until a color change in the pH test paper was noticed. The corresponding breakthrough pressure or entry pressure was recorded as the water entry pressure.

Dust Protection Test

The procedure outlined in Section 5.2 of the International Electrotechnical Commission (IEC) publication reference 60529, Edition 2.1 (2001-02) was used.

Water Splash Test

This test was developed with reference to tests developed by the International Electrotechnical Commission (IEC) to demonstrate IPX4 water protection. The IEC is affiliated with the International Organization for Standards (ISO) and publishes the IP code entitled "Degrees of Protection Provided by Enclosures" to describe a system for classifying the degrees of protection provided by enclosures for electrical equipment. One of the enumerated objects of the standard is to protect the equipment inside an enclosure against harmful effects due to ingress of water. The IPX4 standard is described in IEC publication reference 60529, Edition 2.1 (2001-02). The test used herein was adapted from the IEC test, but modified to more clearly test the effect of different materials on water splash protection.

Figure 5:
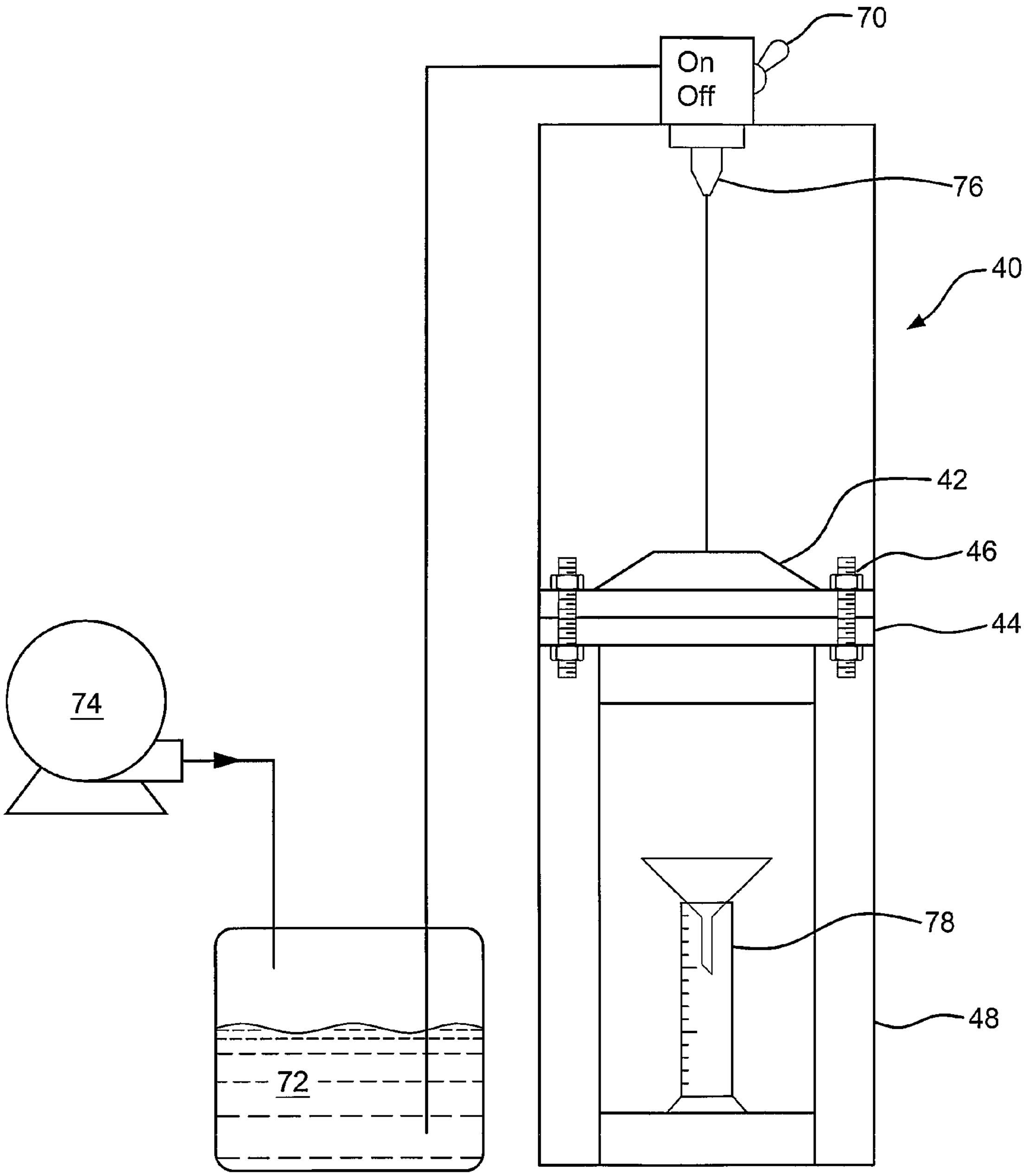
FIG. 5 represents the test apparatus used in the water splash test.

As shown in FIG. 5, the test fixture consists of a cylindrical enclosure (40) constructed of clear acrylic. The enclosure was 8 inches in diameter and 12 inches in height with a wall thickness of 0.25 inches. The enclosure was equipped with a sample holder at the bottom. The sample holder consists of a top (42) and bottom plate (44) between which the sample was held in place using o-rings. A circular sample of over an inch in diameter was used. The top and bottom plates were sealed using a clamp (46). The enclosure was seated on an aluminum frame (48).

By turning the valve switch (70) on, the sample was sprayed with DI water from a pressurized water tank (72) connected to a compressed air source (74). The surface of the sample covering an inch in diameter was exposed to a direct splash of water through the nozzle (76) with a diameter of 0.38 mm. The nozzle was 20 cm above the sample.

Each sample was exposed to water for one minute at a flow rate of 70 ml/min. Any water that passed through the sample during the test duration was collected using a graduated cylinder (78). The water flow rate through the sample was recorded by measuring the volume of water collected per duration of the test (ml/min).

As described in the examples below, various acoustically resistive protective cover assemblies were tested. Table 1 reflects results from the splash test illustrating the effect of the diffusion layer and spacer on water splash protection. The data described in Comparative Example 4 and Comparative Example 1 respectively demonstrates that a single layer of water repellant porous material or two layers of the same material in contact with each other may not prevent water entry; However, as shown in Example 3, two porous layers in which a gap is provided and at least the internal layer is water repellant has proven to be effective in preventing water entry.

TABLE 1

| | Water Flow Rate (ml/min) | Air Flow Resistance (Rayls) |
|---|---|---|
| Example 1 | 1 | 90 |
| Example 2 | 0 | 100 |
| Example 3 | 0 | 145 |
| Example 4 | 4 | 25 |
| Example 5 | 0 | 165 |
| Comparative Example 1 | 10 | 165 |
| Comparative Example 2 | 53 | 13 |
| Comparative Example 3 | 25 | 90 |
| Comparative Example 4 | 40 | 80 |
| Comparative Example 5 | 25 | 25 |

EXAMPLE 1

An acoustic protective cover assembly was constructed using two layers. The first layer was made of a fully reticulated polyurethane foam having an air flow resistance of 5 Rayls (SIF® foam, Reilly Foam Corporation, 75 pores per inch, 1.6 mm thick). The first layer was stacked on top of the second layer. The second layer had a degree of protection of 5, i.e. IP5 according to results from the dust protection test. The second layer was a water repellant non-woven polyester material commercially available and sold under the tradename GORE™ PROTECTIVE COVER GAW 102 manufactured by W.L. Gore & Associates, Inc. This assembly was tested for water splash protection and resistance to air flow. The orientation of the sample was such that the first layer was the one directly exposed to water splash. This bi-layered assembly had excellent acoustic properties, as evidenced by an air flow resistance of 90 Rayls yet allowed only 1 ml/min of water to go through the sample during the splash test, thereby providing adequate splash protection.

EXAMPLE 2

An acoustic protective cover assembly was constructed using two layers. The first layer was made of a Nickel plated open cell polyurethane foam material, sold as a component in GORE-SHIELD® GS8000, a product commercially available from W.L. Gore & Associates, Inc. The foam had about 100 pores per inch and was 1.6 mm thick and had an air flow resistance of 15 Rayls. The first layer was stacked on top of the second layer, made of a water repellant non-woven polyester material commercially available and sold under the tradename GORE™ PROTECTIVE COVER GAW 102 manufactured by W.L. Gore & Associates, Inc. The second layer had a degree of protection of 5, i.e. IP5 according to results from the dust protection test. This assembly was tested for water splash protection and resistance to air flow. The orientation of the sample was such that the first layer was the one directly exposed to water splash. This bi-layered assembly had excellent acoustic performance as evidenced by an air flow resistance of 100 Rayls yet did not allow any water to go through the sample during the splash test, thereby providing adequate splash protection.

EXAMPLE 3

An acoustic protective cover assembly was constructed of two layers. The first layer was made of a polyester woven material, Product No: PES 51/18 commercially sold under the tradename SAATIFIL® by SaatiTech, a division of Saati Group, Inc. The product has the following nominal properties: 0.1 mm thickness; 18% open area. The second layer was made of a water repellant non-woven polyester material commercially available and sold under the tradename GORE™ PROTECTIVE COVER GAW 102 manufactured by W.L.

Gore & Associates, Inc. The second layer had a degree of protection of 5, i.e. IP5 according to results from the dust protection test. A gap of 1.6 mm was created between the two layers by using a ring of spacer material. The spacer ring consists of a closed cell polyurethane foam (Part #4701-30-20031-04, PORON®, Rogers Corporation, Conn.) of thickness 1.6 mm and ring width of 11 mm. This stacked assembly was tested for water splash protection and resistance to air flow. This bi-layered assembly did not allow any water to go through the sample during the splash test, thereby providing adequate splash protection.

EXAMPLE 4

An acoustic protective cover assembly was constructed of two layers of a water repellant perforated metal foil material commercially available and sold under the tradename GORE™ PROTECTIVE COVER GAW 401 manufactured by W.L. Gore & Associates, Inc. The metal foil was made of Nickel and had the following nominal properties: air flow resistance 11 Rayls; water entry pressure 20 cm $H_2O$; 45% open area. A gap of 3.6 mm was created between the two foil layers by using two rings of spacer material. The spacer ring consists of a silicone rubber gasket of thickness 1.8 mm and ring width of 11 mm. This stacked assembly was tested for water splash protection and resistance to air flow. This bi-layered assembly had excellent acoustic performance as evidenced by an air flow resistance of 25 Rayls and it allowed 4 ml/min of water to flow through the sample during the splash test, thereby providing splash protection.

EXAMPLE 5

An acoustic protective cover assembly was constructed of two layers of a non-woven polyester water repellant material commercially available and sold under the tradename GORE™ PROTECTIVE COVER GAW 102 manufactured by W.L. Gore & Associates, Inc. A gap of 1.6 mm was created between the two porous water repellant layers by using a ring of spacer material. The spacer ring consists of a closed cell polyurethane foam (Part #4701-30-20031-04, PORON, Rogers Corporation, Conn.) of thickness 1.6 mm and ring width of 11 mm. This stacked assembly was tested for water splash protection and resistance to air flow. This bi-layered assembly had excellent acoustic performance as evidenced by an air flow resistance of 165 Rayls and yet it did not allow any water to flow through the sample during the splash test, thereby providing adequate splash protection.

COMPARATIVE EXAMPLE 1

An acoustic cover was constructed of two layers of the water repellant polyester non-woven material described in Example 1. The two layers were stacked together on top of each other. This assembly was tested for water splash protection and air flow resistance. As shown in Table 1, the cover assembly allowed water to flow through at a rate of 10 ml/min indicating poor protection from water splash.

COMPARATIVE EXAMPLE 2

An acoustic cover was constructed of two layers of the open cell polyurethane foam material described in Example 1. The two layers were stacked together on top of each other. This assembly was tested for water splash protection and air flow resistance. As shown in Table 1, the cover assembly allowed water to flow through at a rate of 53 ml/min indicating poor protection from water splash.

COMPARATIVE EXAMPLE 3

An acoustic protective cover was constructed using the materials described in Example 1 and tested for water splash protection. The orientation of the sample was such that the second layer was the one directly exposed to water splash. As shown in Table 1, the cover assembly allowed water to go through the sample at a rate of 25 ml/min, thereby providing poor water splash protection.

COMPARATIVE EXAMPLE 4

An acoustic cover made of a water repellant non-woven polyester material commercially available and sold under the tradename GORE™ PROTECTIVE COVER GAW 102 manufactured by W.L. Gore & Associates, Inc was tested for water splash protection and air flow resistance. As shown in Table 1, this layer by itself allowed water to go through the sample at a rate of 40 ml/min, thereby providing poor water splash protection.

COMPARATIVE EXAMPLE 5

An acoustic cover was constructed of two layers of the water repellant perforated metal foil material described in Example 4. The two layers were stacked together on top of each other. This assembly was tested for water splash protection and air flow resistance. As shown in Table 1, although the cover assembly had low air flow resistance, it allowed water to flow through at a rate of 25 ml/min indicating poor protection from water splash.

What is claimed is:

1. An acoustically resistive cover comprising:

a. first acoustically resistive layer consisting of a porous polymeric material b. second acoustically resistive water repellant layer consisting of a porous polymeric material, and c. that the first layer does not contact the second layer; and said acoustically resistive cover has airflow resistance less than about 500 Rayl at the perimeter of the first layer and the water repellant layer to provide space between the first layer and the water repellant layer.

2. The acoustically resistive cover of claim 1 in which the space between the first layer and the second layer is at least 0.25 mm.

3. The acoustically resistive cover of claim 2 in which the spacer is foam.

4. The acoustically resistive cover of claim 2 in which the spacer is closed cell foam.

5. The acoustically resistive cover of claim 4 in which the spacer is a double-sided adhesive material.

6. The acoustically resistive cover of claim 1 in which the space between the first layer and the second water repellant layer is at least 1 mm.

7. The acoustically resistive cover of claim 1 in which the space between the first layer and the second water repellant layer is at least 0.50 mm.

8. An acoustically resistive cover for an opening in an enclosure, the enclosure separating an enclosed space from ambient space, the acoustically resistive cover comprising:

a. diffusion layer consisting of an acoustically resistive porous polymeric material adjacent to ambient space, and b. water repellant layer consisting of an acoustically resistive porous polymeric material adjacent to the enclosed space.

9. The acoustic cover material of claim 8 in which the diffusion layer is reticulated foam.

10. The acoustic cover material of claim 8 in which the water repellant layer is non woven polyester.

11. The acoustically resistive cover of claim 8 having an air flow resistance of less than about 500 Rayls.

12. The acoustically resistive cover of claim 8, further comprising a pressure sensitive adhesive disposed upon the diffusion layer.

13. An acoustically resistive cover for an opening in a case, the case separating an enclosed space from the ambient space and having an exposed face oriented toward the ambient space and an internal face oriented toward the enclosed space, the acoustically resistive cover comprising:

a. acoustically resistive porous layer consisting of a porous polymeric material disposed upon the exposed face of the case, and b. acoustically resistive water repellant material disposed upon the internal face of the case.

14. A water resistant enclosure comprising:

a. a case defining an internal space within the enclosure and an ambient space outside the enclosure, b. an opening within the case, and c. acoustically resistive cover assembly comprising a diffusion layer consisting of a porous polymeric material adjacent to the ambient space, and a water repellant layer consisting of an acoustically resistive polymeric material adjacent to the internal space and wherein a space is provided between the diffusion layer and the water repellant layer.

* * * * *

UNITED STATES PATENT AND TRADEMARK OFFICE

CERTIFICATE OF CORRECTION

PATENT NO. : 8,157,048 B2
APPLICATION NO. : 12/428104
DATED : April 17, 2012
INVENTOR(S) : Chad Banter, Andrew Holliday and Victor Lusvardi It is certified that error appears in the above-identified patent and that said Letters Patent is hereby corrected as shown below:

Title Page

Item (54) In the title: change “Splash Proof Acoustically Resistive Color Assembly” to “Splash Proof Acoustically Resistive Cover Assembly”.

Signed and Sealed this
Thirty-first Day of May, 2016

Michelle K. Lee
*Director of the United States Patent and Trademark Office*